(12) United States Patent
La Fetra

(10) Patent No.: US 11,734,114 B2
(45) Date of Patent: Aug. 22, 2023

(54) PROGRAMMABLE ERROR CORRECTION CODE ENCODING AND DECODING LOGIC

(71) Applicant: Advanced Micro Devices, Inc., Santa Clara, CA (US)

(72) Inventor: Ross V. La Fetra, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/116,952

(22) Filed: Dec. 9, 2020

(65) Prior Publication Data

US 2022/0179741 A1    Jun. 9, 2022

(51) Int. Cl.
G06F 11/10 (2006.01)
H03M 13/45 (2006.01)
H03M 13/00 (2006.01)

(52) U.S. Cl.
CPC ......... G06F 11/1076 (2013.01); H03M 13/45 (2013.01); H03M 13/616 (2013.01)

(58) Field of Classification Search
CPC .. G06F 11/1076; H03M 13/45; H03M 13/616
See application file for complete search history.

(56) References Cited

U.S. PATENT DOCUMENTS

| | | | |
|---|---|---|---|
| 2011/0138249 A1 | 6/2011 | Kern | |
| 2012/0079342 A1 | 3/2012 | Lu | |
| 2012/0324310 A1* | 12/2012 | Oshida | H03M 13/63 714/755 |
| 2012/0324312 A1* | 12/2012 | Moyer | G06F 11/1004 714/763 |
| 2014/0075272 A1 | 3/2014 | Kern | |
| 2015/0207629 A1* | 7/2015 | Oshida | H03M 13/29 380/28 |
| 2017/0004037 A1* | 1/2017 | Park | G11C 29/52 |
| 2017/0147432 A1* | 5/2017 | Suh | G06F 3/0679 |
| 2020/0151053 A1* | 5/2020 | Cha | G06F 11/1044 |
| 2020/0195275 A1* | 6/2020 | Chow | H03M 13/158 |
| 2021/0374002 A1* | 12/2021 | Chiang | G06F 11/1076 |

FOREIGN PATENT DOCUMENTS

KR    20180019818 A    2/2018

OTHER PUBLICATIONS

The International Searching Authority, "Search Report" in Application No. PCT/US2021/062201, dated Mar. 24, 2022, 14 pages.

* cited by examiner

*Primary Examiner* — Thien Nguyen
(74) *Attorney, Agent, or Firm* — Hickman Becker Bingham Ledesma LLP

(57) ABSTRACT

A memory module includes logic elements that are configurable to a particular ECC implementation. As used herein, the term "ECC implementation" refers to ECC functionality for performing error detection and subsequent processing, for example using the results of the error detection to perform error correction and to encode data such that any errors can be later identified and corrected. The approach allows a memory module or computing device to be configured to a specific ECC implementation without requiring requests to be sent back and forth between a host.

20 Claims, 8 Drawing Sheets

```
┌─────────────────────────────────────────────────────────────────┐
│ A configurable logic block is configured according to an ECC    │
│ implementation                                              202 │
└─────────────────────────────────────────────────────────────────┘
                                  │
                                  ▼
┌─────────────────────────────────────────────────────────────────┐
│ The configurable logic block receives data to be encoded        │
│                                                             204 │
└─────────────────────────────────────────────────────────────────┘
                                  │
                                  ▼
┌─────────────────────────────────────────────────────────────────┐
│ The data is passed through the configurable logic block to      │
│ produce check bits                                          206 │
└─────────────────────────────────────────────────────────────────┘
                                  │
                                  ▼
┌─────────────────────────────────────────────────────────────────┐
│ The data is encoded by appending the check bits to the data and │
│ stored in memory                                            208 │
└─────────────────────────────────────────────────────────────────┘

- - - - - - - - - - - - - - - - - - - - - - - - - - - - - - - - - -

┌─────────────────────────────────────────────────────────────────┐
│ A configurable logic block is configured according to an ECC    │
│ implementation                                              210 │
└─────────────────────────────────────────────────────────────────┘
                                  │
                                  ▼
┌─────────────────────────────────────────────────────────────────┐
│ The configurable logic block receives data to be decoded        │
│                                                             212 │
└─────────────────────────────────────────────────────────────────┘
                                  │
                                  ▼
┌─────────────────────────────────────────────────────────────────┐
│ The data is passed through the configurable logic block to      │
│ produce syndrome                                            214 │
└─────────────────────────────────────────────────────────────────┘
                                  │
                                  ▼
┌─────────────────────────────────────────────────────────────────┐
│ Error correction is performed using the syndrome and the        │
│ corrected data is provided to a processor                   216 │
└─────────────────────────────────────────────────────────────────┘
```

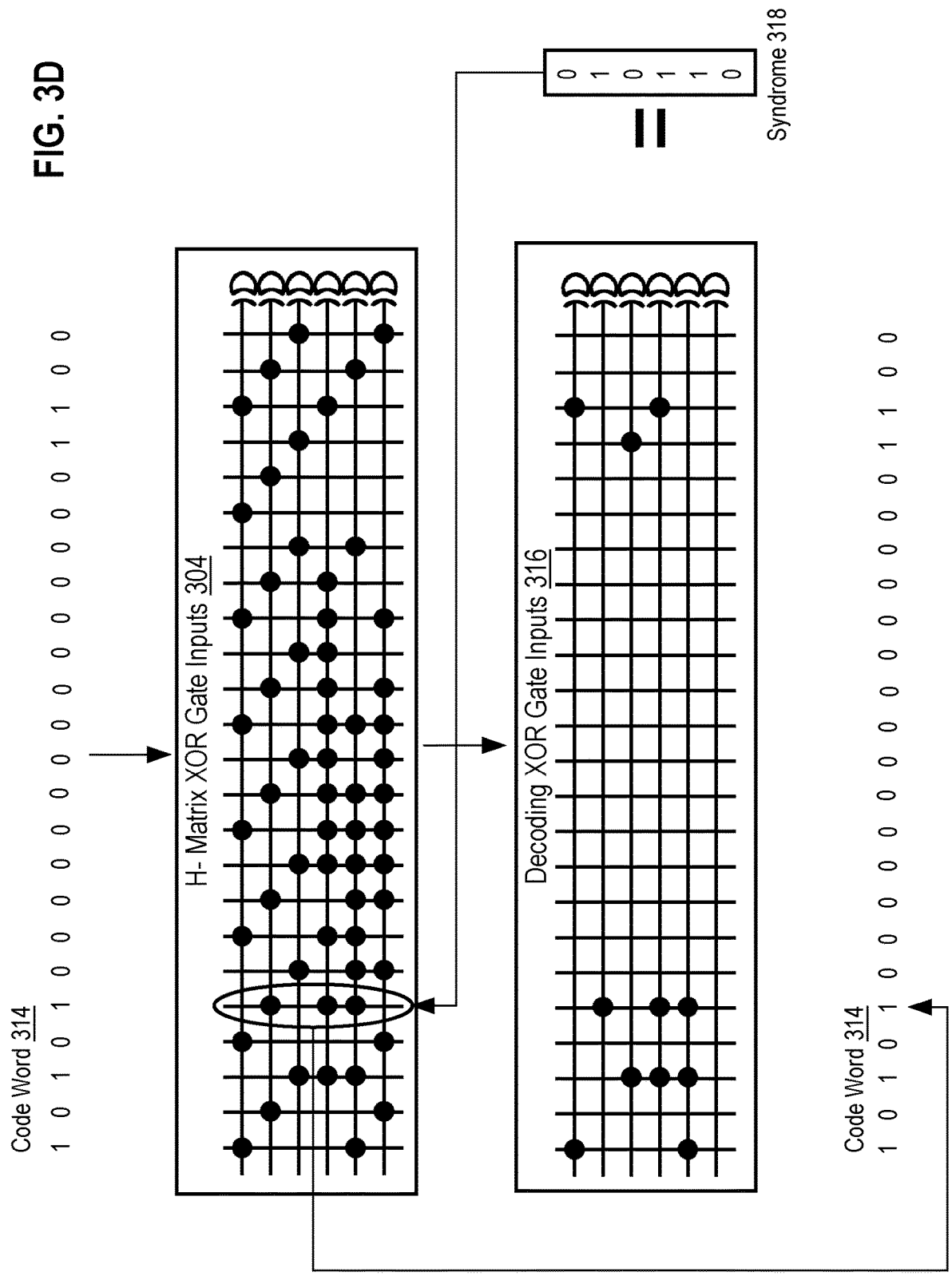

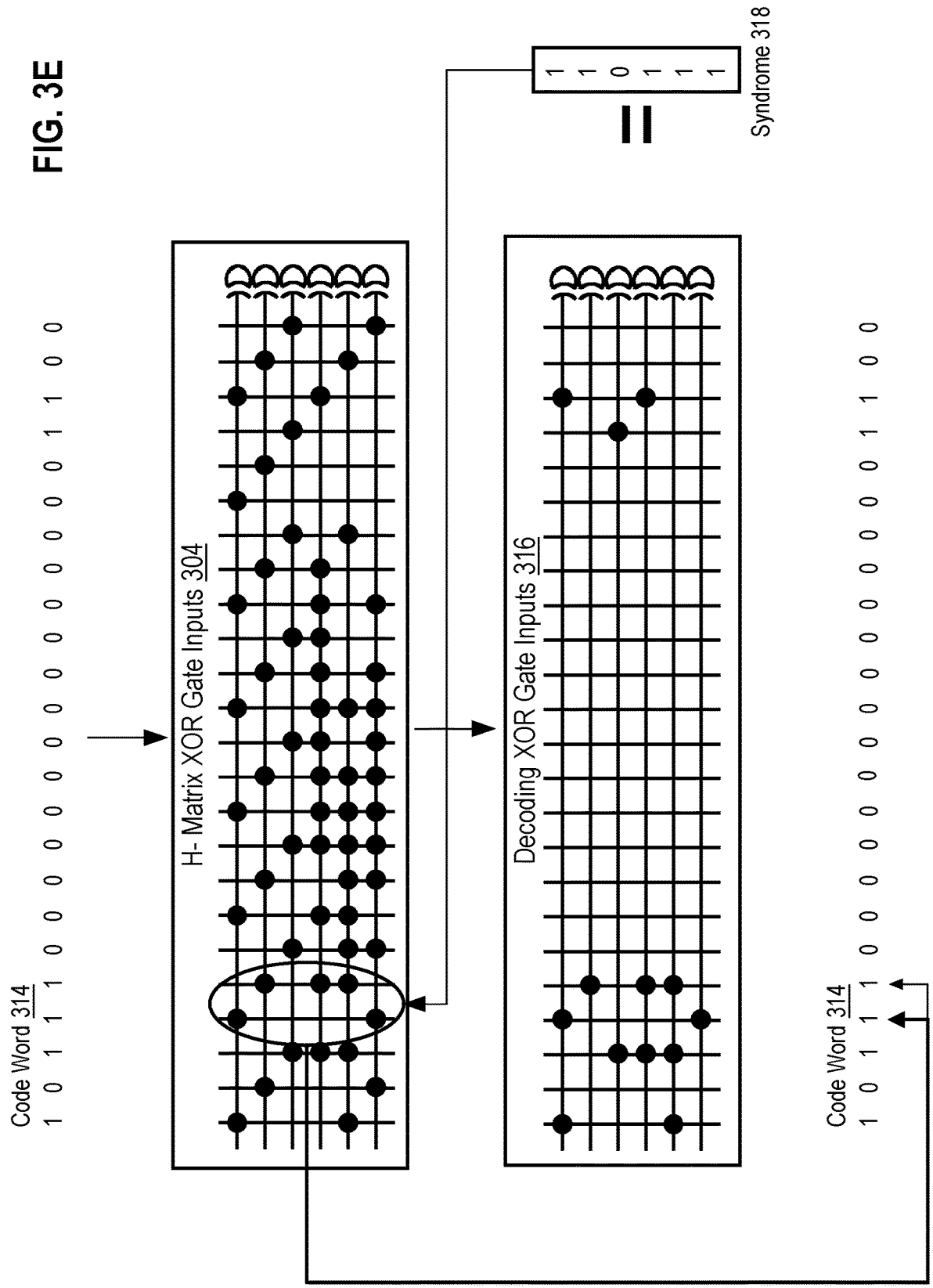

PROGRAMMABLE ERROR CORRECTION CODE ENCODING AND DECODING LOGIC

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Further, it should not be assumed that any of the approaches described in this section are well-understood, routine, or conventional merely by virtue of their inclusion in this section.

Error Correction Code (ECC) memory modules implement an ECC engine to detect and correct internal data corruption. One of the limitations of conventional ECC memory modules is that the particular ECC implementation is configured by a manufacturer and tends to be proprietary to a manufacturer's approach. Thus, if a manufacturer configures a host with a specific ECC implementation, any memory controller that accesses the data must be configured with the same ECC implementation. As used herein, the term "host" refers to any type of processing element, such as a Central Processing Unit (CPU), Graphics Processing Unit (GPU), memory controller, etc. For example, if a Processor-In-Memory (PIM)-based memory module uses the result bits for internal error detection and correction, and to identify corrupted data that cannot be corrected, the PIM-based memory module and the host must use the identical ECC implementation to ensure the same level of error protection and avoid inconsistent use of the result bits. This is problematic because PIM-based memory modules may be designed for use with multiple hosts and yet the host designer or company, e.g., of a System-on-a-Chip (SoC), may not want the PIM-based memory vendor to know the ECC implementation they are using, which may be proprietary. Similarly, a benefit of using PIM-based memory modules is the speed at which data can be processed as data does not have to be transferred from the PIM-based memory module to an external processor. Thus, there is a need for a programmable memory module which can be configured to implement an ECC to decode data stored in the memory module.

Additionally, it may be desirable for any process that receives encoded data to be able to decode the data without sending a request back to the original encoder. For instance, a computing device receiving encoded data over a network may be improved by being able to perform error checks on the data without sending requests over the network to a sending device. Thus, there is a need for a system that can be configured to implement an ECC implementation instead of or in addition to the conventional ECC memory module.

BRIEF DESCRIPTION OF THE DRAWINGS

Embodiments are depicted by way of example, and not by way of limitation, in the figures of the accompanying drawings and in which like reference numerals refer to similar elements.

FIG. 2 is a flow diagram that depicts an approach for programming an ECC encoder or decoder.

FIG. 3D depicts an example of decoding a stored code word.

FIG. 3E depicts an example of decoding a stored code word to identify a multi-bit error

DETAILED DESCRIPTION

In the following description, for the purposes of explanation, numerous specific details are set forth in order to provide a thorough understanding of the embodiments. It will be apparent, however, to one skilled in the art that the embodiments may be practiced without these specific details. In other instances, well-known structures and devices are shown in block diagram form in order to avoid unnecessarily obscuring the embodiments.

I. Overview
  II. Architecture
  III. Generalized Encoder/Decoder
  IV. Operational Overview
  V. Encoding
  VI. Decoding I. Overview A memory module includes one or more general purpose ECC engines that can be programed to match a particular ECC implementation. As used herein, the term "ECC implementation" refers to ECC functionality for performing error detection and subsequent processing, for example using the results of the error detection to perform error correction and to encode corrupted data that cannot be corrected, etc.

By providing a general purpose ECC engine, the memory module can be configured to implement an ECC implementation without being pre-programmed to any specific ECC implementation. This can be especially valuable in PIM-based memory modules which could be paired with different host devices that support different ECC implementations. The memory module is configured to receive input defining an ECC implementation, such as an H-matrix used by a host. When the memory module receives a request to encode data to be stored in the memory module or decode data stored in the memory module, the memory module executes the ECC implementation through selective use of logic elements of the memory module.

II. Architecture

Figure 1A:
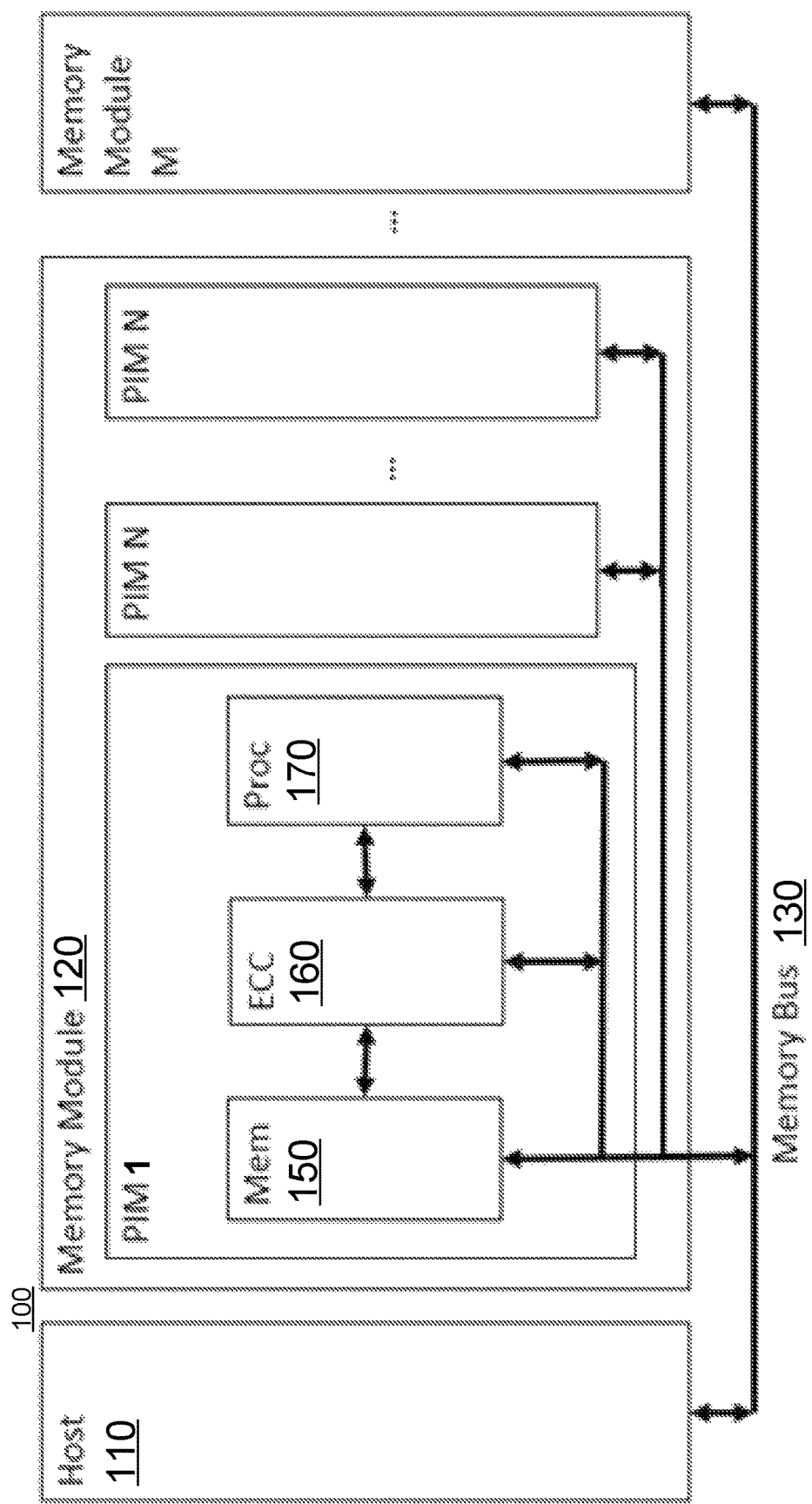
FIG. 1A is a block diagram that depicts a memory arrangement.

FIG. 1A is a block diagram that depicts a memory arrangement 100. The memory arrangement 100 includes a host 110 and a memory module 120. The host 110 and the memory module 120 are communicatively coupled via a memory bus 130. As used herein, the term "bus" refers to any type of wired or wireless coupling, such as wires, conductors, and/or wireless communications links. In addition, although embodiments are described herein in the context of buses, embodiments are not limited to buses per se and are applicable to other forms of memory connections, such as serial links and capacitive/inductive coupling. Embodiments are depicted in the figures and described herein in the context of a single memory module 120 for purposes of explanation, but embodiments are applicable to memory arrangements with any number of memory modules, such as the M memory modules in FIG. 1.

The host writes data to and receives data from the memory module 120. The host may be configured to obtain data directly from the memory without the error correction being performed or from the error correction code (ECC) encoder and/or decoder 160. The memory arrangement 100 may include other elements that are not depicted in the figures and described herein for purposes of explanation.

The memory module 120, which may be for example a DRAM memory module, includes a memory arrange having N PIM Units (PIM Unit 1-PIM Unit N). Each PIM unit contains a memory 150, ECC encoder and/or decoder 160, and a processor 170. The memory modules may include other elements, such as buffers and decoders, that are not depicted in the figures and described herein for purposes of explanation. The PIM units include processing logic and storage, such as local registers, for performing arithmetic operations. Although embodiments are depicted in the figures and described herein in the context of PIM-based memory modules, embodiments are not limited to this context and are applicable to non-PIM-based memory modules.

Memory module 120 may comprise a plurality of logic elements. The logic elements comprise hardware components configured to perform logic operations. Example logic elements include AND gates, OR gates, NOR gates, NAND gates, XOR gates, and XNOR gates. Logic elements may be implemented in hardware, such as by using diodes or transistors acting as electronic switches.

Figure 1B:
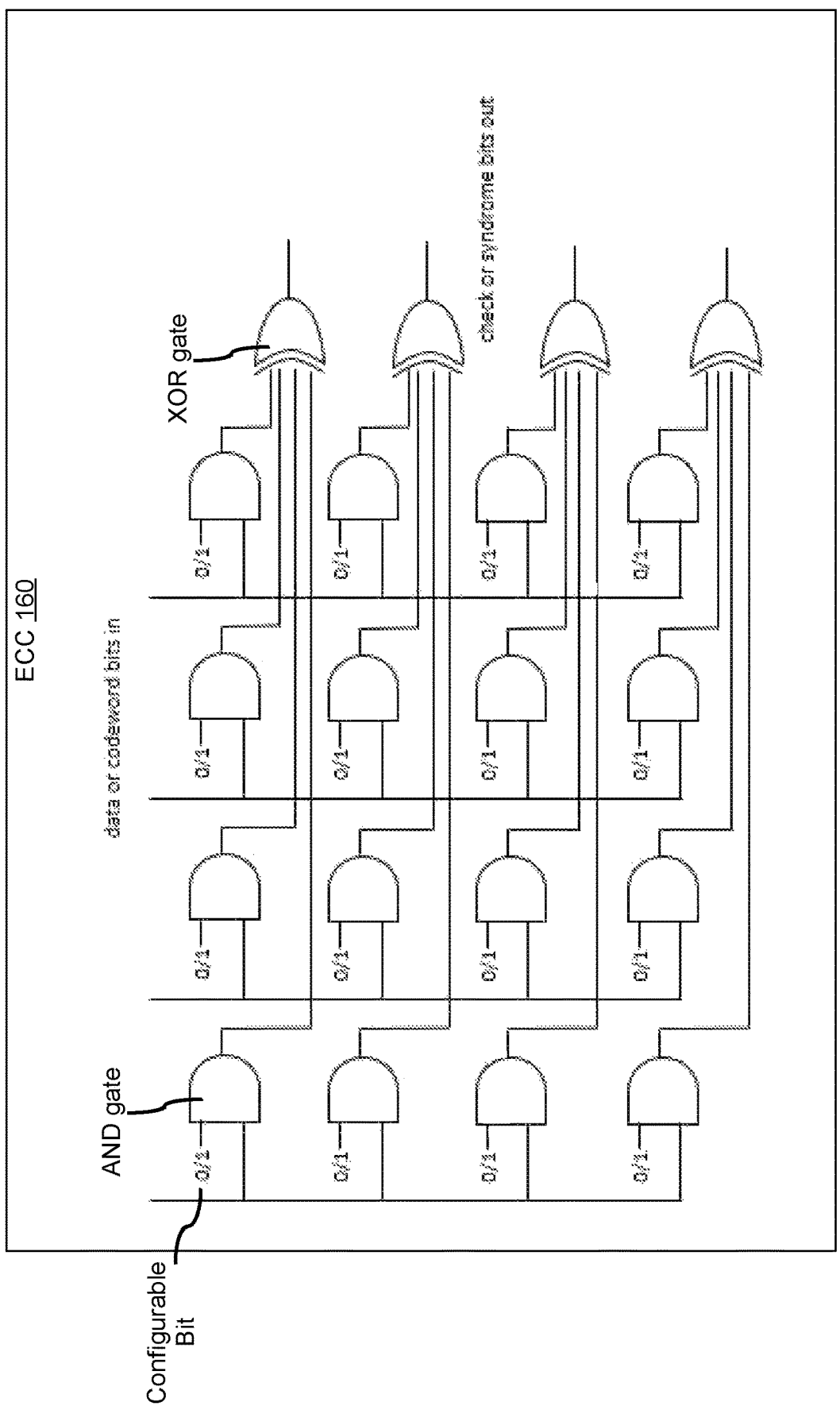
FIG. 1B depicts an example of configurable logic elements of an ECC encoder and/or decoder 160.

FIG. 1B depicts an example of configurable logic elements of an ECC encoder and/or decoder 160. "Configurable logic elements" or "configurable logic block", as used herein, refer to a fixed set of hardware logic that can be configured to different ECC implementations by setting particular bits in particular gates. The example of FIG. 1B is one implementation of configurable logic elements that can be used as a configurable ECC encoder and/or decoder. Other options may include schemes that use multiplexers at various levels. In the implementation of FIG. 1B, a plurality of AND gates determine which data bits will pass through to an XOR gate. Each of the AND logic elements of FIG. 1B include a bit that is set through configuration instructions. As used herein, "masking" a data bit corresponds to setting the bit to "0" which, for an AND gate, causes the input value to not be passed through to the XOR gate, while unmasked data bits correspond to bits that are set to "1", such that an input value is passed through the AND gate to the XOR gate. The ECC encoder and/or decoder 160 may be masked according to a parity check matrix (H-matrix) and/or a generator matrix (G-matrix) as described further herein.

III. Generalized Encoder/Decoder

According to an embodiment, the memory module 120 is configured with a generalized encoder and/or decoder for an ECC implementation. As used herein, the term "generalized encoder and/or decoder" refers to programmable processing logic that encodes data for an ECC implementation and/or decodes data for an ECC implementation. The generalized encoder and/or decoder is programmable such that it can be implemented with any of a plurality of ECC implementations as long as it is encoded with information specific to the ECC implementation. Engines for implementing the encoder and/or decoder may be implemented in several different ways that may vary depending upon a particular implementation. Examples may include, without limitation, CPUs, GPUs, microcontrollers, Field Programmable Gate Arrays (FPGAs), Application Specific Integrated Circuits (ASICs), and other types of processing logic. The ECC engines may augment any ECC capabilities that are internal to the memory module 120, such as an on-die ECC engine in a High Bandwidth Memory-3 (HBM3) memory module.

The ECC encoder and/or decoder 160 may be implemented in between memory 150 and processors 170, such that data being accessed from memory 150 can be decoded prior to use by processors 170 and data generated by processor 170 can be encoded prior to being stored in memory 150. In FIG. 1A, each of the memory modules include masking instructions for logic elements implemented through the ECC encoder and/or decoder in the PIM units. In other implementations, the masking instructions may be stored separately and used to mask the logic elements. Additionally or alternatively, a plurality of PIM units may share access to a single set of masking instructions. As another example, a multi-layer memory module may be configured with one set of masking instruction per layer.

A host processing element, also referred to herein as a "host," programs the generalized encoder/decoder by providing masking instructions which identify a plurality of logic elements to mask for a specific ECC implementation. For example, the host may provide data corresponding to an H-matrix used in a specific ECC implementation. The memory module may identify logic elements to activate and logic elements to not activate, or mask, based on the H-matrix. For example, an FPGA, EPROM, etc., may be programmed with a particular H-matrix and instructions on how to use the H-matrix to encode or decode data. As another example, the host may provide, to a memory module for execution by a PIM unit or a microcontroller, data defining the H-matrix for a particular implementation. Masking instructions are processed by the processing logic of the PIM units that is used for processing PIM commands, by separate processing logic within the PIM units, or a microcontroller within the PIM units.

The masking instructions and any additional ECC implementation instructions described herein may be stored in the memory array, i.e., the banks, of the memory module 120 as depicted in FIG. 1. Alternatively, the instructions may be stored in the PIM units, or in a separate device. The masking instructions and any additional ECC implementation instructions may be any type or form of instructions. For example, the instructions may be in the form of source code, e.g., Register Transfer Language (RTL) instructions, parsed source code, compiled code, e.g., object code, or executable code, e.g., binary code. Another example form of instructions is a hardware description language used with FPGAs, such as Verilog and VHDL. A host may compile source code to create executable code that is provided to a PIM module to be stored and executed. Alternatively, a host may provide source code to a PIM or microcontroller that compiles the source code to create executable code that is stored and executed. Thus, the creation of executable code from source code may be performed at a host or at a memory module.

The ECC encoder and/or decoder may be configured to encode all data written to the memory from the processor and decode all data read from the memory by the processor. By automatically encoding and decoding data accessed from and stored into the memory by the processor, the memory module improves performance of the system by ensuring that the data stored in the memory can be successfully decoded without requiring a specialized command to cause the decoding or detect encoded data.

According to an embodiment, the generalized ECC encoder/decoder perform ECC processing between a processor and memory within a PIM unit. For example, the ECC encoder/decoder may be a configurable logic block configured to receive data from a memory of a PIM unit, perform error checking on the data, and provide the results to the processor of the PIM unit. Conversely, the ECC encoder/decoder may be configured to receive new data from processor of the PIM unit, encode the new data with check bits, and cause the encoded data to be stored in the memory. In another implementation, the ECC encoder/decoder may be configured to receive data over a network and perform error correction and/or encoding on the data prior to utilizing the data or sending the data to storage.

According to an embodiment, the generalized encoder/decoder is configured to be implemented with different ECC implementations. The different ECC implementations may includer proprietary encoders/decoders used by a host machine. The generalized encoder/decoder can be configured to a specific ECC implementation by programming the ECC with a specific H-matrix used by the ECC implementation. This allows the generalized encoder/decoder to be adapted to different systems when the exact implementation of the ECC used by the host machine varies.

IV. Operational Overview

The generalized encoder/decoder described herein may be implemented through hardware by using configuration information to identify logic elements to activate for an ECC implementation. Other embodiments may implement similar logic processes in software through digitally programmed calculations.

FIG. 2 is a flow diagram that depicts an approach for implementing an ECC encoder and/or decoder. Steps 202-208 comprise a method for using configurable logic elements to encode data prior to storage. At step 202, configurable logic block is configured according to an ECC implementation. For example, a configurable logic block may comprise an XOR tree comprising a plurality of XOR gates. The configurable logic block may be configured to mask data bits in a plurality of AND gates leading to the XOR gates in the XOR tree according to a set of configuration instructions. The instructions may directly indicate the bits of the AND gates to mask. Additionally or alternatively, the instructions may comprise a binary or symbol matrix that the memory module uses to determine which bits of the AND gates to mask. Implementations for masking specific bits to match an ECC implementation are described further herein.

Figure 3A:
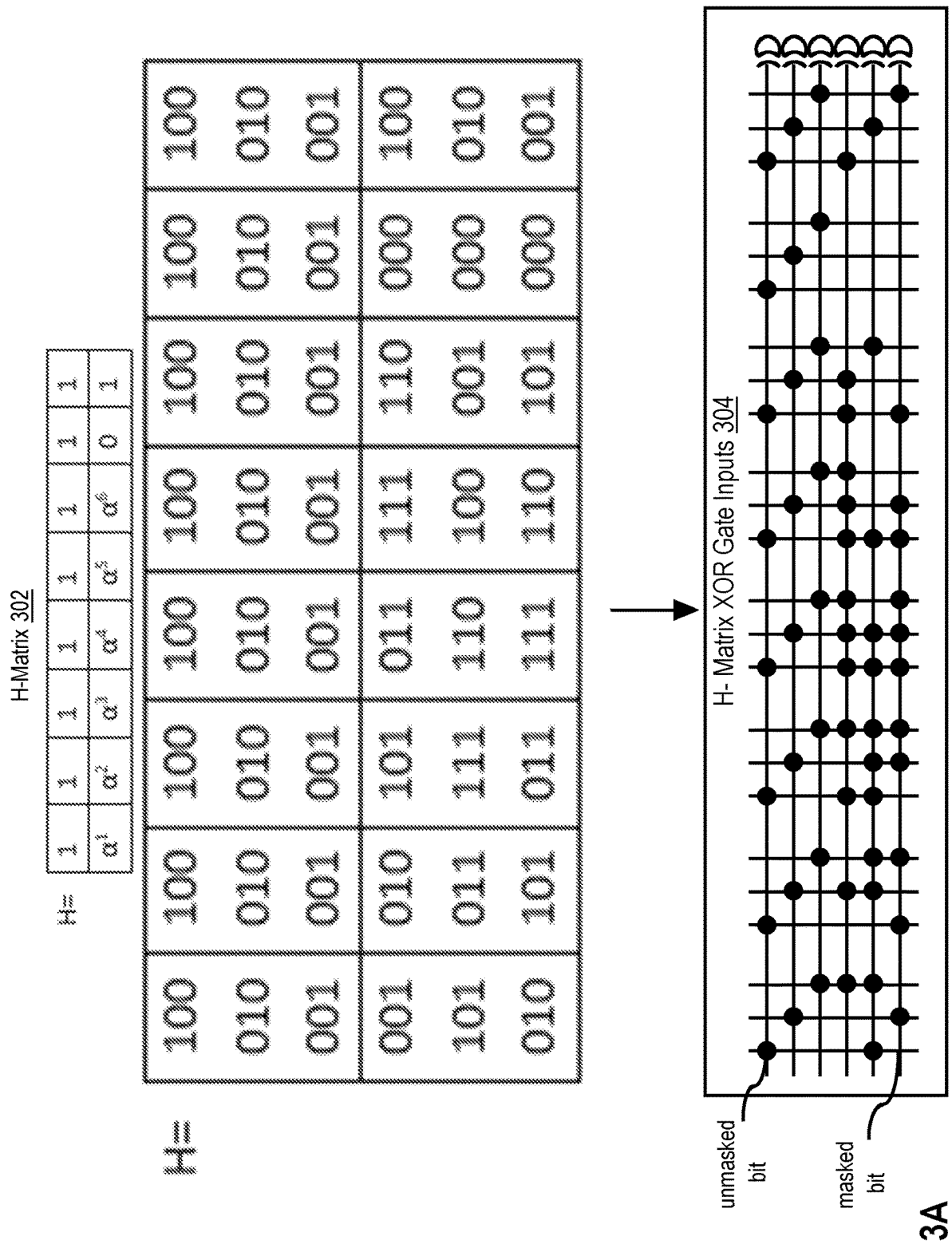
FIG. 3A depicts an example of using an H-matrix to configure an ECC implementation.

FIG. 3A depicts an example of using an H-matrix to configure an ECC implementation. H-Matrix 302 comprises an H-matrix received from a host device which represents a linear function that produces a code word from data. The H-matrix depicted in FIG. 3A comprises a $GF(2^3)$ representation, a, and a binary representation. While the methods described herein are described with respect to binary matrices, the same methods may be applied to any H-matrix. Columns 0-17 represent data while columns 18-23 represent check bits. Using the H-matrix, the system generates H-matrix XOR gate inputs 304 comprising unmasked data bits and masked data bits in AND gates of the configurable logic elements. The form of H-matrix XOR gate inputs 304 is depicted in equivalent form to the H-matrix to provide a clear example. In embodiments, the form of the H-matrix XOR gate inputs 304 comprises an XOR tree where data bits in AND gates leading to the XOR gates are masked according to the configuration instructions. Once configured through the masking of data bits, H-matrix XOR gate inputs 304 may then be utilized to perform error correction on encoded data.

Figure 3B:
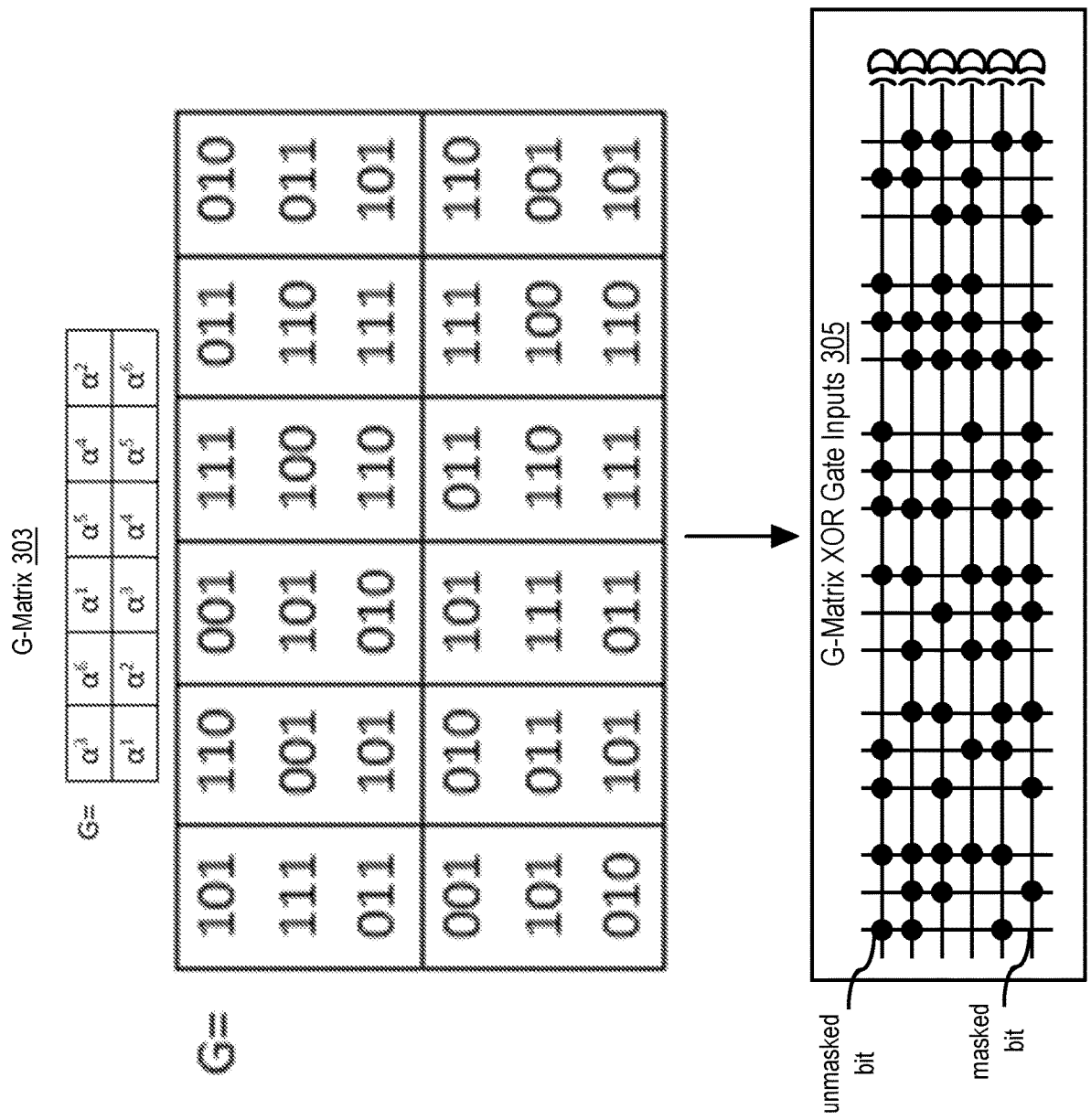
FIG. 3B depicts an example of using a G-matrix to configure an ECC implementation.

FIG. 3B depicts an example of using a G-matrix to configure an ECC implementation. The G-matrix 303 comprises a G-matrix that may be derived from the H-matrix using known techniques and/or may be provided by the host device. The G-matrix depicted in FIG. 3B comprises a $GF(2^3)$ representation, a, and a binary representation. While the methods described herein are described with respect to binary matrices, the same methods may be applied to any G-matrix. Using the G-matrix, the system generates G-matrix XOR gate inputs 305 comprising unmasked data bits and masked data bits in AND gates of the configurable logic elements. The form of G-matrix XOR gate inputs 305 is depicted in equivalent form to the G-matrix to provide a clear example. In embodiments, the form of the G-matrix XOR gate inputs 305 comprises an XOR tree where data bits in AND gates leading to the XOR gates are masked according to the configuration instructions. Once configured, the G-matrix XOR gate inputs 305 may then be utilized to generate check bits for data to be encoded.

At step 204, the configurable block receives data to be encoded. For example, a PIM module comprises a processor that allows reads and writes to the memory without requiring connection to a host processor. When the processor completes computations with stored data, the processor stores the results in the memory. Prior to storing the results, the memory module may pass the data through the ECC encoder to cause the ECC encoder to encode the results using the methods described herein.

While embodiments are described with request to PIM storage and retrieval of data, the systems and methods described herein may be applied to any system which stores or receives data encoded by a separate device. For example, if a computing device received encoded information over a network, the computing device may use the methods described herein to perform error correction on the data during retrieval without requiring additionally requests to be sent to the encoding device.

In an embodiment, a computing device is configured with multiple error correction code implementations. When the computing device receives encoded data over a network, the computing device may identify the error correction code implementation that applies to the data, such as based on a sender of the data or based on additional information sent with the data. The computing device may decode the data using the identified error correction code implementation. Additionally, if data is to be sent back to a separate device, the computing device may identify an error correction code implementation corresponding to the separate device and encode the data using the error correction code implementation.

At step 206, data is passed through the configurable logic block to produce check bits. For example, the configurable logic elements may be configured with masked and unmasked bits according to a G-matrix. The data may be passed through the configurable logic elements, with data corresponding to unmasked AND gates proceeding to the XOR gates, to produce the check bits.

At step 208, the data is encoded by appending the check bits to the data and stored in memory. Encoding schemes using configurable logic elements are described further herein.

Steps 210-216 comprise a method for using configurable logic elements to perform error correction on data prior to usage. At step 210, a configurable logic block is configured according to an ECC implementation. For example, a configurable logic block may comprise an XOR tree comprising a plurality of XOR gates. The configurable logic block may be configured to mask data bits in a plurality of AND gates leading to the XOR gates in the XOR tree according to a set of configuration instructions. The instructions may directly indicate the bits of the AND gates to mask. Additionally or alternatively, the instructions may comprise a binary or symbol matrix that the memory module uses to determine which bits of the AND gates to mask. Implementations for masking specific bits to match an ECC implementation are described further herein.

At step 212, the configurable logic block receives data to be decoded. For example, a PIM module comprises a processor that allows reads and writes to the memory without requiring connection to a host processor. If data stored in the memory of the PIM was created by a host processor and thus encoded with a particular ECC implementation, the processor of the PIM may request the data from the memory in order to perform one or more operations on the data. As a practical example, a PIM may be configured to perform a simulation using data written by a host in memory and then store the results of the simulation in memory. Prior to sending the data to the processor to perform the simulation, the memory module may pass the data through the ECC decoder to cause the ECC decoder to decode the data using the methods described herein.

At step 214, data is passed through the configurable logic block to produce a syndrome. For example, the configurable logic elements may be configured with masked and unmasked bits according to an H-matrix. The data may be passed through the configurable logic elements, with data corresponding to unmasked AND gates proceeding to the XOR gates, to produce a syndrome.

At step 216, the error correction is performed using the syndrome and the corrected data is provided to a processor. For example, the syndrome may be used to identify an error location and magnitude so that the error can be corrected. Decoding schemes using configurable logic elements are described further herein.

V. Encoding

In an embodiment, the ECC implementation comprises encoding new data to be stored in memory. The encoding may be performed in response to a request from a processor to store data in memory and/or in response to receiving data over a network to be stored with other encoded data.

In an embodiment, encoding data comprises determining a plurality of check bits for a particular data value using the configurable logic elements configured according to a particular ECC implementation. The check bits may be appended to the bits of the particular data value to generate a code word for the particular data value. The code word may then be stored in the memory. In an embodiment, the ECC encoder determines the plurality of check bit values by sending bits corresponding to the data value through the configurable logic elements, thereby creating a matrix multiply. For example, the ECC encoder may include a plurality of AND gates with bits set according to an H-matrix. As only the AND gates which receive data bits from the data value will send a data bit to an XOR gate, columns that do not correspond to a bit of the data value will not contribute a data bit to the XOR gate to compute a value for a row corresponding to the XOR gate. Thus, if the particular data value includes a "1" in the $0^{th}$ bit and the $2^{nd}$ bit, the ECC encoder may only send bits to the XOR gate from AND gates in the $0^{th}$ column and $2^{nd}$ column.

Figure 3C:
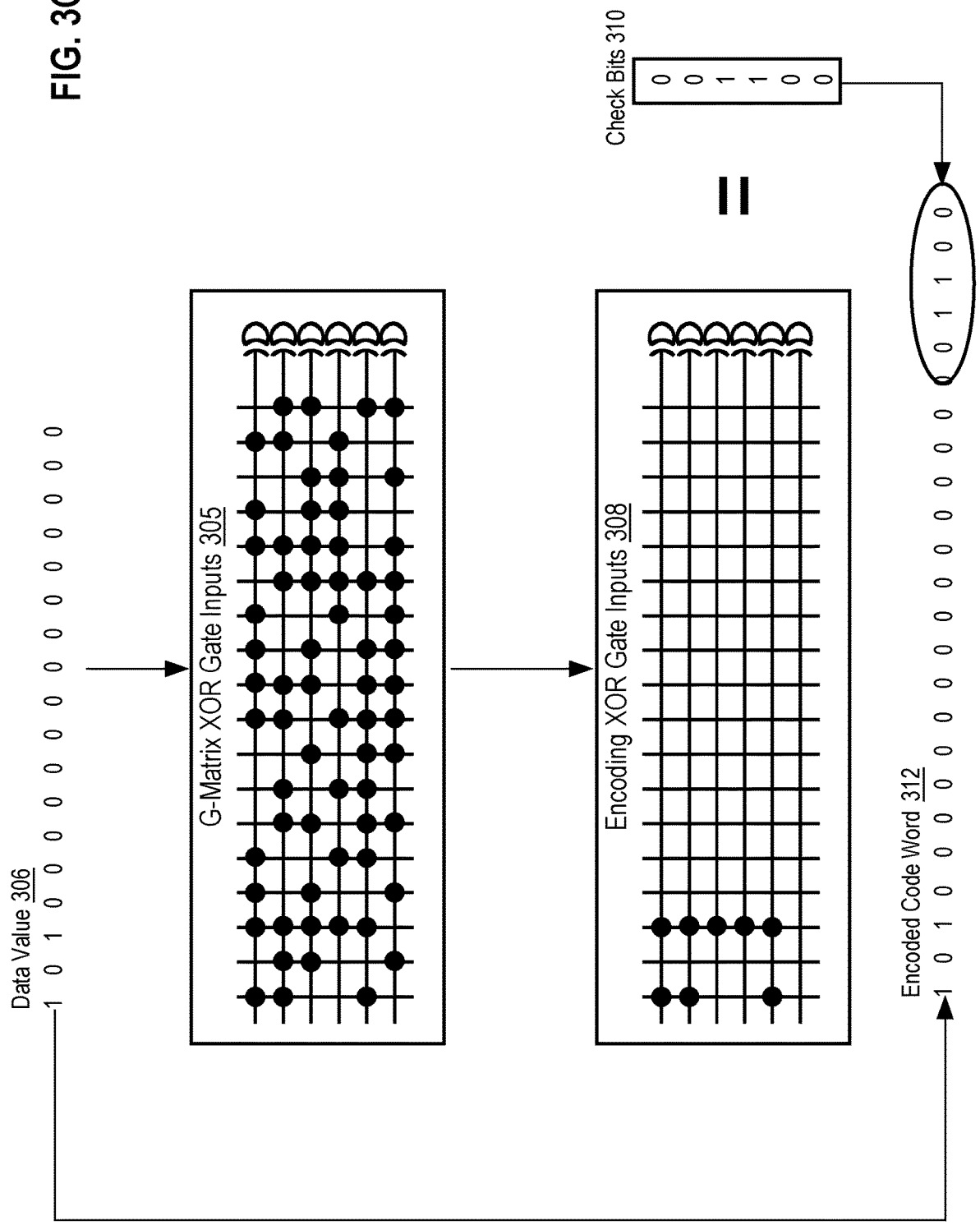
FIG. 3C depicts an example of encoding a particular data value.

FIG. 3C depicts an example of encoding a particular data value. In the example of FIG. 3C, the system uses the G-matrix to compute the check bits for the data value. In other embodiments, the system may use the H-matrix and compute values for check bit columns that would cause a computed syndrome to be 0 when the data value is multiplied through the logic elements.

In FIG. 3C, data value 306 comprises a binary representation of a data value to be encoded. The data value 306 is multiplied by the G-matrix encoded in the logic elements. Each circle of G-matrix XOR gate inputs 305 corresponds to an AND gate with an unmasked bit. Thus, any bits passing through a gate that does not have a circle will not be passed through to the XOR gates. When data value 306 is passed through G-matrix XOR gate inputs 305, each data bit (1) of the data value 306 passes through the AND gates in the corresponding column while, thereby creating encoding XOR gate inputs 308. Encoding XOR gate inputs 304 comprise each gate through which a data bit passes. As data bits are only set to "1" in the first and third columns, only the first and third columns of G-matrix XOR gate inputs 305 are depicted in encoding XOR gate inputs 308.

After the remaining bits of encoding XOR gate inputs 308 pass through the XOR gates, they produce check bits 310. For instance, the first row includes two bits that passed through AND gates, thereby producing a 0 when they pass through the XOR gate. Similarly, rows 2 and 5 contain two bits, thereby also creating 0s when they pass through their respective XOR gates. Rows 3 and 4 each have a single bit that pass through the XOR gate, thus creating a 1, and row 6 has no bits passing through the XOR gate. Thus, the final check bits 310 comprise (0 0 0 1 1 0 0). Check bits 310 are then appended to data value 306 to generate encoded code word 312.

The above description provides a hardware implementation of a matrix multiply used to create check bit values. The matrix multiply may be computed as:

$$\sum_{j=1}^{K} G_{ij}D_j = C_i \text{ for } i = 1 \ldots R$$

where $G_{ij}$ is the value of the G-matrix for the $i^{th}$ row and $j^{th}$ column, D is the data value for the $j^{th}$ column, $C_i$ is the check bit value for the $i^{th}$ row, K is the total number of columns, and R is the number of rows of the G-matrix. The above matrix multiply may be performed in symbol space or binary space to the same results.

VI. Decoding

In an embodiment, the ECC implementation comprises decoding data received at the ECC decoder. The decoding may be performed in response to a request from a processor to access stored data stored in a memory module and/or in response to receiving encoded data over a network. Decoding data may comprise using a stored code word to identify an error in one or more bits of the code words and adjust the bits of the code word to fix the error.

In an embodiment, the ECC decoder first computes a syndrome column using the configurable logic elements configured according to a particular ECC implementation. The system then compares the syndrome column to each column corresponding to the configurable logic elements to identify a column that matches the syndrome. The system determines that the column matching the syndrome contains the error. In a binary implementation, the value of the error is always 1, so once the column is identified, the bit can be fixed.

FIG. 3D depicts an example of decoding a stored code word. In FIG. 3D, code word 314 comprises data encoded using an ECC implementation that contains an error. Similar to encoding, the code word 314 is multiplied by the H-matrix encoded in the logic elements. Each circle of H-matrix XOR gate inputs 304 corresponds to an AND gate with an unmasked bit. As code word 314 includes the check bits generated in the encoding step, the check bits are additionally fed through the configurable logic elements, configured using the H-matrix which comprises columns corresponding to the check bits. Thus, decoding XOR gate inputs 316 include five columns through which bits pass to compute the resulting syndrome. The memory module compares syndrome 318 to the columns of H-matrix XOR gate inputs 304. As syndrome 318 includes a 1 in the second, fourth, and fifth rows, the memory module searches for a column in the second, fourth, and fifth rows. Syndrome 318 matches the fifth column of H-matrix XOR gate inputs 304. Thus the fifth bit of code word 314 contains the error. The memory module may correct the code word by changing the bit by the error value. Thus, the 1 in the fifth column is replaced with a 0.

The above description provides a hardware implementation of a matrix multiply used to compute the syndrome. The matrix multiply may be computed as:

$$\sum_{j=1}^{KN} H_{ij} D_j = S_i \text{ for } i = 1 \ldots$$

where $H_{ij}$ is the value of the H-matrix for the $i^{th}$ row and $j^{th}$ column, D is the data value for the $j^{th}$ column of the code word, $S_i$ is the syndrome value for the $i^{th}$ row, N is the total number of columns, and R is the number of rows of the H-matrix. The above matrix multiply may be performed in symbol space or binary space to the same results.

The embodiment of FIG. 3D represents a method for identifying and fixing a single bit error. Thus, matching the syndrome to a column of the H-matrix can be performed by identifying a column of the H-matrix that has the same values as the syndrome in the same locations. If the computed syndrome is a column of only 0 values, the memory module may determine that no error exists in the code word. If the computed syndrome is a column that does not match any of the columns in the H-matrix, the memory module may determine that the code word contains a multi-bit or multi-symbol error.

For multi-bit errors, the system may utilize symbol notation to identify either single bit errors or multi-bit errors within a same symbol. A symbol, as used herein, refers to a set of a plurality of bits, such as 3-bits. For example, the first representation of H-matrix in FIG. 3A includes two rows of symbols denoted by a first row containing 1s and a second row containing powers of α, each value of which comprising a 3-bit symbol. 3×3 matrices corresponding to the symbols may comprise a representation of a multiplication of two 3-bit symbols, one of which comprising a constant that is encoded into the matrix. For example, the first 3 rows and first 3 columns correspond to a first multiplication of $D_0$ by 1 while the second 3 rows and first 3 columns correspond to a first multiplication of $D_0$ by $\alpha^1$, where $D_0$ is the first data symbol (3 bits).

In an embodiment, the decoding is performed using an H-matrix where, in symbol space, each column for the first row includes a symbol value of 1. For example, in the H-matrix of FIG. 3A, each repeating set of 3 columns for the first 3 rows comprises a diagonal matrix with 1s in the diagonal and 0s elsewhere. When a row's value is 1 for each column, the syndrome comprises the error. Thus, the first three values in syndrome 318 of FIG. 3D, $S_0$=010, would comprise the error. The error may be applied to each symbol column to determine when the syndrome matches a symbol. Applying the error to each symbol column may comprise passing the error through a set of AND gates corresponding to a symbol of the H-matrix and computing the results through the XOR gate.

Using FIG. 3D as a practical example, when the error of 010 is multiplied by the first set of three columns of H-matrix XOR gate inputs 304, only the second column receives a data bit that passes through the AND gates. As the second column includes a set bit in the second and sixth row, the XOR gates compute a value of (010001). As this does not match the syndrome of (010110), the system may check the next set of columns. When the error of 010 is multiplied by the second set of columns of H-matrix XOR gate inputs 304, only the fifth column receives a data bit that passes through the AND gates. As the fifth column includes a set bit in the second, fourth, and fifth rows, the XOR gates compute a value of (010110) which matches the syndrome. Thus, the error is in the fifth column.

FIG. 3E depicts an example of decoding stored data to identify a multi-bit error. If the error had comprised 110, the memory module would have kept the first two columns and compared it to the error. For example, changing the code word to contain an error in the fourth and fifth columns (so the first six values of the code word are 101110), the computed syndrome would have comprised (110111). If the error of 110 is applied to the first symbol, i.e. the first three columns of H-Matrix XOR Gate Inputs 304, the first and second columns remain, creating a value of (110011). As this value does not match the syndrome, the memory module moves to the next symbol. Applying 110 to the second symbol, i.e. the second three columns of H-Matrix XOR Gate Inputs 304, leaves the fourth and fifth columns which, when combined through XOR gates, creates a value of (110111) which matches the syndrome. Thus, the system would determine that an error exists in the second symbol, and applying the error value 110 to the second symbol indicates the error is in the fourth and fifth columns.

In a general scenario, the system may be configured to compute an error location using a ratio between a $n^{th}$ row of the H-matrix and a plurality of other rows of the H-matrix. These ratios may be computed in advance and stored for the ECC implementation using the following equation:

$$I_{ij} = \frac{H_{ij}}{H_{nj}}$$

where $I_{ij}$ is the ratio value for a particular row and a particular column, $H_{ij}$ is the value of the H-matrix at the particular row and particular column, and $H_{nj}$ is the value of the H-matrix at the $n^{th}$ row. As noted above, if $H_{nj}$ is "1" for every row, the ratio equals the value of the H-matrix for the particular column and row. The row selected to be $H_{nj}$ from the plurality of rows of the H-matrix can be any of the rows. In an embodiment, if a selected row for $H_{nj}$ includes a "0" in a column, the system selects a different row for $H_{nj}$ for that column, such that the computation of the ratio is not indefinite.

To compute the location of the error, the system may test each column (j) to determine if the following equation is true for every row of the column (j):

$$S_i = I_{ij} * S_n$$

where $S_i$ is the syndrome value for the $i^{th}$ row and $S_{1n}$ is the syndrome value for the same row as used for $H_{nj}$. Thus, if for a first column, $H_{nj}$ is the second row, then $S_n$ would be the syndrome value for the $n^{th}$ row. Additionally, if for a second column, $H_{nj}$ is the sixth row, then $S_n$ would be the syndrome value for the sixth row. If, for a particular column, the product of the syndrome value and the ratio for each row equals the syndrome value for that row, the system may determine that the error exists in the particular column.

The system may further use the values of the syndrome to compute the error magnitude. This step may be performed before, after, or in parallel with the computation of the location of the error. The error value may be computed as:

$$E_j = S_n * H_{nj}^{-1}$$

where $E_j$ is the error. The rows used for $S_n$ and $H_{nj}^{-1}$ may be the same rows used in the computation of the location of the error and/or may be different rows as long as the same row is used for $S_n$ and $H_{nj}^{-1}$ in the error computation equation. The value for $H_{nj}^{-1}$ may be precomputed for each column prior to implementation. The value may additionally use the same for each column or may vary rows between columns. The system may store data indicating which row is being used for $H_{nj}^{-1}$ for each column.

Once the error value and error location are known, the system may correct the error by applying the error value to the error location. If the system performs the computations above to identify the location of the error and none of the computations satisfy the above equation for all rows, the system may determine that the code word includes a multi-symbol error. Generally, the above described methods can detect any error that the initial ECC code can detect and can correct any single symbol errors. The methods described herein can be performed with respect to any linear block code.

The invention claimed is:

1. A method comprising:
   receiving, at a set of configurable logic circuits, configuration instructions defining:
     data or code word bits to mask in the set of configurable logic circuits for an error correction code (ECC) implementation, and
     a matrix corresponding to the ECC implementation that contains an identity matrix or a plurality of identical matrices;
   receiving, at the set of configurable logic circuits, data to be encoded or decoded according to the ECC implementation; and
   executing the ECC implementation using the set of configurable logic circuits with the data or code word bits masked according to the configuration instructions.

2. The method of claim 1, wherein:
   the configuration instructions comprise define the data or code word bits to mask in the set of configurable logic circuits according to said matrix;
   said matrix is a generator matrix (G-matrix) corresponding to the ECC implementation;
   executing the ECC implementation comprises encoding data, encoding the data comprising performing, for a particular data value:
   determining a plurality of check bit values for the data value using the set of configurable logic circuits with the data or code word bits masked according to the configuration instructions; and
   generating and storing a code word for the particular data value, the code word comprising data of the data value and the plurality of check bit values.

3. The method of claim 2, wherein determining the plurality of check bit values comprises, using the set of configurable logic circuits with the data or code word bits masked according to the configuration instructions, multiplying the code word by the G-matrix to produce the plurality of check bit values.

4. The method of claim 1, wherein:
   the configuration instructions comprise define the data or code word bits to mask in the set of configurable logic circuits according to said matrix;
   said matrix is a parity check matrix (H-matrix) corresponding to the ECC implementation;
   executing the ECC implementation comprises decoding a codeword, decoding the codeword comprising:
   using the set of configurable logic circuits with the data or code word bits masked according to the configuration instructions, computing a syndrome column from the codeword;
   identifying a particular column of the H-matrix that matches the syndrome column and, in response, determining that an error exists in a value of the codeword corresponding to the particular column of the H-matrix.

5. The method of claim 1, wherein:
   the configuration instructions comprise define the data or code word bits to mask in the set of configurable logic circuits according to said matrix;
   said matrix is a parity check matrix (H-matrix) corresponding to the ECC implementation;
   executing the ECC implementation comprises decoding a codeword, decoding the codeword comprising:
   storing, for each symbol set of the H-matrix, a set of ratios of a first set of values corresponding to a first set of rows to a second set of values corresponding to a second set of rows;
   using the set of configurable logic circuits with the data or code word bits masked according to the configuration instructions computing a syndrome;
   determining that a first portion of the syndrome corresponding to the first set of rows is equal to a product of the ratio for a particular symbol set and a second portion of the syndrome corresponding to the second set of rows and, in response, determining that a portion of the data corresponding to the particular symbol set includes an error.

6. The method of claim 5, wherein decoding the codeword further comprises:
   determining a magnitude of the error by computing a quotient of the first portion of the syndrome with the first set of values corresponding to the first set of rows for the particular symbol;
   correcting the data using the magnitude of the error and the portion of the codeword that was determined to include the error.

7. The method of claim 1, wherein the configurable logic circuits are configured to provide the ECC implementation for a memory module by performing encoding of data generated by a processor prior to storing a codeword in memory or decoding of the codeword stored in the memory.

8. The method of claim 1, wherein the configurable logic circuits are configured to provide the ECC implementation for data sent or received over a network.

9. An apparatus comprising:
   a set of configurable logic circuits;
   wherein the set of configurable logic circuits are configured according to configuration instructions defining:
     data or code word bits to mask in the set of configurable logic circuits for an error correction code (ECC) implementation, and a matrix corresponding to the ECC implementation that contains an identity matrix or a plurality of identical matrices; and wherein the set of configurable logic circuits are configured to execute the ECC implementation by masking the data or codeword bits in the set of configurable logic circuits according to the configuration instructions.

10. The apparatus of claim 9, wherein:

the configuration instructions comprise define the data or code word bits to mask in the set of configurable logic circuits according to said matrix;

said matrix is a generator matrix (G-matrix) corresponding to the ECC implementation;

executing the ECC implementation comprises encoding data, encoding the data comprising performing, for a particular data value:

determining a plurality of check bit values for the data value using the set of configurable logic circuits with the data or code word bits masked according to the configuration instructions; and generating and storing a code word for the particular data value, the code word comprising data of the data value and the plurality of check bit values.

11. The apparatus of claim 10, wherein determining the plurality of check bit values comprises, using the set of configurable logic circuits with the data or code word bits masked according to the configuration instructions, multiplying the code word by the G-matrix to produce the plurality of check bit values.

12. The apparatus of claim 9, wherein:

the configuration instructions comprise define the data or code word bits to mask in the set of configurable logic circuits according to said matrix;

said matrix is a parity check matrix (H-matrix) corresponding to the ECC implementation;

executing the ECC implementation comprises decoding a codeword, decoding the codeword comprising:

using the set of configurable logic circuits with the data or code word bits masked according to the configuration instructions, computing a syndrome column from the codeword;

identifying a particular column of the H-matrix that matches the syndrome column and, in response, determining that an error exists in a value of the codeword corresponding to the particular column of the H-matrix.

13. The apparatus of claim 9, wherein:

the configuration instructions comprise define the data or code word bits to mask in the set of configurable logic circuits according to said matrix;

said matrix is a parity check matrix (H-matrix) corresponding to the ECC implementation;

executing the ECC implementation comprises decoding a codeword, decoding the data comprising:

storing, for each symbol set of the H-matrix, a set of ratios of a first set of values corresponding to a first set of rows to a second set of values corresponding to a second set of rows;

using the set of configurable logic circuits with the data or code word bits masked according to the configuration instructions computing a syndrome;

determining that a first portion of the syndrome corresponding to the first set of rows is equal to a product of the ratio for a particular symbol set and a second portion of the syndrome corresponding to the second set of rows and, in response, determining that a portion of the codeword corresponding to the particular symbol set includes an error.

14. The apparatus of claim 13, wherein decoding the codeword further comprises:

determining a magnitude of the error by computing a quotient of the first portion of the syndrome with the first set of values corresponding to the first set of rows for the particular symbol;

correcting the data using the magnitude of the error and the portion of the codeword that was determined to include the error.

15. The apparatus of claim 9, wherein the configurable logic circuits are configured to provide the ECC implementation for a memory module by performing encoding of data generated by a processor prior to storing a codeword in memory or decoding of codeword stored in the memory.

16. The apparatus of claim 9, wherein the configurable logic circuits are configured to provide the ECC implementation for data sent or received over a network.

17. A Processor-In-Memory (PIM) based memory module comprising:

a memory storing data encoded according to an error correction code (ECC) implementation;

a processor configured to perform operations on data stored in the memory and write additional data to the memory; and a set of configurable logic circuits configured according to configuration instructions defining:

data or code word bits to mask in the set of configurable logic circuits for an error correction code (ECC) implementation, and a matrix corresponding to the ECC implementation that contains an identity matrix or a plurality of identical matrices;

wherein the set of configurable logic circuits are configured to execute the ECC implementation by masking the data or code word bits in the set of configurable logic circuits according to the configuration instructions before a write to the memory or before a read by the processor.

18. The memory module of claim 17, wherein:

the configuration instructions comprise define the data or code word bits to mask in the set of configurable logic circuits according to said matrix;

said matrix is a generator matrix (G-matrix) corresponding to the ECC implementation;

executing the ECC implementation comprises encoding data, encoding the data comprising performing, for a particular data value:

determining a plurality of check bit values for the data value using the set of configurable logic circuits with the data or code word bits masked according to the configuration instructions; and generating and storing a code word for the particular data value, the code word comprising data of the data value and the plurality of check bit values.

19. The memory module of claim 17, wherein:

the configuration instructions comprise define the data or code word bits to mask in the set of configurable logic circuits according to said matrix;

said matrix is a parity check matrix (H-matrix) corresponding to the ECC implementation;

executing the ECC implementation comprises decoding a codeword, decoding the codeword comprising:

using the set of configurable logic circuits with the data or code word bits masked according to the configuration instructions, computing a syndrome column from the codeword;

identifying a particular column of the H-matrix that matches the syndrome column and, in response, determining that an error exists in a value of the codeword corresponding to the particular column of the H-matrix.

20. The memory module of claim 17, wherein:

the configuration instructions comprise define the data or code word bits to mask in the set of configurable logic circuits according to said matrix;

said matrix is a parity check matrix (H-matrix) corresponding to the ECC implementation;

executing the ECC implementation comprises decoding a codeword, decoding the codeword comprising:

storing, for each symbol set of the H-matrix, a set of ratios of a first set of values corresponding to a first set of rows to a second set of values corresponding to a second set of rows;

using the set of configurable logic circuits with the data or code word bits masked according to the configuration instructions computing a syndrome;

determining that a first portion of the syndrome corresponding to the first set of rows is equal to a product of the ratio for a particular symbol set and a second portion of the syndrome corresponding to the second set of rows and, in response, determining that a portion of the codeword corresponding to the particular symbol set includes an error;

determining a magnitude of the error by computing a quotient of the first portion of the syndrome with the first set of values corresponding to the first set of rows for the particular symbol;

correcting the codeword using the magnitude of the error and the portion of the codeword that was determined to include the error.

* * * * *